US012610755B2

(12) United States Patent
Zhang et al.

(10) Patent No.: US 12,610,755 B2
(45) Date of Patent: Apr. 21, 2026

(54) SEMICONDUCTOR STRUCTURE AND METHOD FOR MANUFACTURING SEMICONDUCTOR STRUCTURE

(71) Applicant: ENKRIS SEMICONDUCTOR, INC., Suzhou (CN)

(72) Inventors: Liyang Zhang, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 367 days.

(21) Appl. No.: 18/460,459

(22) Filed: Sep. 1, 2023

(65) Prior Publication Data

US 2024/0079232 A1 Mar. 7, 2024

(30) Foreign Application Priority Data

Sep. 5, 2022 (CN) .......................... 202211078550.6

(51) Int. Cl.
*H10P 14/20* (2026.01)
*H10D 62/85* (2025.01)
(Continued)

(52) U.S. Cl.
CPC ..... *H10P 14/3416* (2026.01); *H10D 62/8503* (2025.01); *H10D 62/852* (2025.01);
(Continued)

(58) Field of Classification Search
CPC ............. H10P 14/3416; H10P 14/2921; H10P 14/3442; H10P 50/242; H10P 14/22;
(Continued)

(56) References Cited

U.S. PATENT DOCUMENTS 8,886,334 B2 * 11/2014 Ghaffari ............. A61B 5/02028
607/115
9,650,723 B1 * 5/2017 D'Evelyn ............... C30B 7/105
(Continued)

FOREIGN PATENT DOCUMENTS

CN 104993023 A * 10/2015 ............. H10H 20/80
CN 107611233 A * 1/2018 ............. H01L 33/02
FR 3114910 A1 * 4/2022 ............. H10P 10/12

*Primary Examiner* — Mohammed Shamsuzzaman
(74) *Attorney, Agent, or Firm* — Westbridge IP LLC

(57) ABSTRACT

Disclosed are a semiconductor structure and a method for manufacturing a semiconductor structure, the method includes: forming a first transition layer, a protection layer and an active structure layer sequentially epitaxially on a side of a growth substrate, where a surface, away from the growth substrate, of the first transition layer is a two-dimensional flat surface; on a first plane, an orthographic projection of the active structure layer is at least partially covered by an orthographic projection of the protection layer, and the first plane is perpendicular to an arrangement direction of the protection layer and the active structure layer; detaching the growth substrate by a laser lift-off process, to make the epitaxial layer transferred to a transfer substrate; etching the first transition layer up to the protection layer, to make a surface, away from the active structure layer, of the protection layer to be a planarization surface.

12 Claims, 4 Drawing Sheets

(51) Int. Cl.
    *H10D 62/852*     (2025.01)
    *H10P 50/24*     (2026.01)
    *H10P 14/22*     (2026.01)
    *H10P 14/24*     (2026.01)

(52) U.S. Cl.
    CPC ...... *H10P 14/2921* (2026.01); *H10P 14/3442* (2026.01); *H10P 50/242* (2026.01); *H10P 14/22* (2026.01); *H10P 14/24* (2026.01)

(58) Field of Classification Search
    CPC ........ H10P 14/24; H10P 95/11; H10P 50/246; H10D 62/8503; H10D 62/852; H10D 30/475; H10H 20/018; H10H 20/815
    See application file for complete search history.

(56)           References Cited

U.S. PATENT DOCUMENTS

| | | | |
|---|---|---|---|
| 9,711,354 B2* | 7/2017 | Jang ...................... | H10P 14/276 |
| 2007/0045651 A1* | 3/2007 | Suzuki ................... | H10H 20/81 |
| | | | 257/97 |
| 2011/0133243 A1* | 6/2011 | Song ................... | H10H 20/833 |
| | | | 257/E33.028 |
| 2015/0368833 A1* | 12/2015 | Farah ................... | H10F 71/139 |
| | | | 117/106 |
| 2018/0114878 A1* | 4/2018 | Danesh ............... | H10H 20/825 |
| 2020/0185477 A1* | 6/2020 | Xia ...................... | H10K 59/123 |

\* cited by examiner

Forming an epitaxial layer on a side of a growth substrate, where the epitaxial layer includes a first transition layer, a protection layer and an active structure layer sequentially epitaxially formed on the side of the growth substrate; a surface, away from the growth substrate, of the first transition layer is a two-dimensional flat surface; on a first plane, an orthographic projection of the active structure layer is at least partially covered by an orthographic projection of the protection layer, and the first plane is perpendicular to an arrangement direction of the protection layer and the active structure layer

— S10

Forming a transfer substrate on a side, away from the growth substrate, of the epitaxial layer

— S20

Detaching the growth substrate by a laser lift-off process, where a detaching position is on the first transition layer, to make the epitaxial layer transferred to the transfer substrate

— S30

Etching the first transition layer up to the protection layer, to make a surface, away from the active structure layer, of the protection layer to be a planarization surface

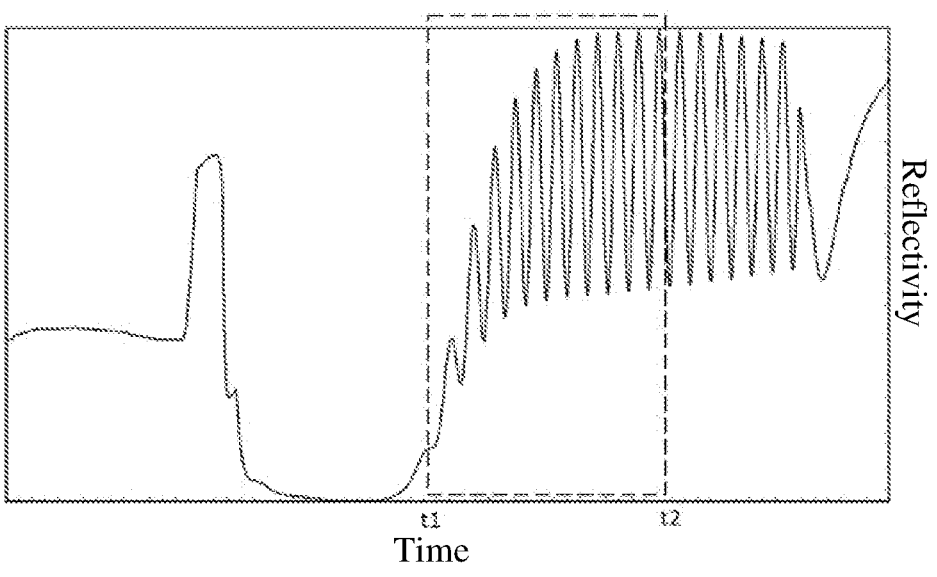

Time t1          t2

Reflectivity

FIG. 2

SEMICONDUCTOR STRUCTURE AND METHOD FOR MANUFACTURING SEMICONDUCTOR STRUCTURE

CROSS-REFERENCE TO RELATED APPLICATIONS

This application claims priority to Chinese Patent Application No. 202211078550.6, filed on Sep. 5, 2022, which is hereby incorporated by reference in its entirety.

TECHNICAL FIELD

The present application relates to the field of semiconductor technologies, and in particular, to a semiconductor structure and a method for manufacturing a semiconductor structure.

BACKGROUND

The nitride materials are the represent material of third-generation semiconductors, especially GaN and AlN materials, all of which belong to wide band gap semiconductors, and have broad market application prospects in semiconductor light-emitting diodes (LEDs), laser diodes (LDs), ultraviolet detectors, electronic power devices and the like, therefore, GaN-based material semiconductor devices have been widely and deeply studied in recent years.

At present, in the fabrication technology of a GaN-based power semiconductor device, one technical route of interest is to transfer a GaN epitaxial structure grown on a substrate to a transfer substrate by a bonding technology and a laser lift-off technology. However, in a detaching process, the GaN epitaxial structure is usually inevitably damaged to a certain extent, therefore, the increase of the leakage current of the semiconductor device and the reduction of the breakdown voltage are easily caused in a subsequent process.

SUMMARY

In view of this, the present application provides a semiconductor structure and a method for manufacturing a semiconductor structure, to weaken a damage degree of a semiconductor epitaxial structure in a detaching process, reduce the leakage current, and increase the breakdown voltage.

According to a first aspect, the present application provides a method for manufacturing a semiconductor structure, including: forming an epitaxial layer on a side of a growth substrate, where the epitaxial layer includes a first transition layer, a protection layer and an active structure layer which are sequentially epitaxially formed on the side of the growth substrate; a surface, away from the growth substrate, of the first transition layer is a two-dimensional flat surface; on a first plane, an orthographic projection of the active structure layer is at least partially covered by an orthographic projection of the protection layer, and the first plane is perpendicular to an arrangement direction of the protection layer and the active structure layer; forming a transfer substrate on a side, away from the growth substrate, of the epitaxial layer; detaching the growth substrate by a laser lift-off process, where a detaching position is on the first transition layer, to make the epitaxial layer transferred to the transfer substrate; etching the first transition layer up to the protection layer, to make a surface, away from the active structure layer, of the protection layer to be a planarization surface.

According to any embodiment of the first aspect of the present application, a laser energy of the laser lift-off process is greater than a band gap energy of the first transition layer, and less than a band gap energy of the protection layer.

According to any embodiment of the first aspect of the present application, a laser energy density of a laser in the laser lift-off process is 200-5000 mJ/cm$^2$.

According to any embodiment of the first aspect of the present application, a heating temperature of a heater in the laser lift-off process is 650-800° C.

According to any embodiment of the first aspect of the present application, a material of the protection layer includes AlN or AlGaN.

According to any embodiment of the first aspect of the present application, N-type doping is performed on the protection layer when the protection layer is formed by epitaxy method.

According to any embodiment of the first aspect of the present application, a material of the first transition layer includes GaN.

According to any embodiment of the first aspect of the present application, the growth substrate includes a sapphire substrate.

According to any embodiment of the first aspect of the present application, a material of the transfer substrate includes any elemental metal or two or more alloys of molybdenum, copper, titanium, tungsten, palladium, platinum, nickel and chromium, or a Si substrate, a SiC substrate, a ceramic substrate, a sapphire, a glass material, an AlSi crystal, InP, GaAs, GaN, or a flexible substrate.

According to any embodiment of the first aspect of the present application, the active structure layer includes a Schottky barrier diode, a field effect transistor, a PN junction diode, a PNP triode, an NPN triode or an insulated-gate bipolar transistor.

According to any embodiment of the first aspect of the present application, an epitaxial growth method of the epitaxial layer includes an atomic layer deposition method, a chemical vapor deposition method, a molecular beam epitaxy method, a plasma enhanced chemical vapor deposition method, a low pressure chemical vapor deposition method, a metal-organic chemical vapor deposition method, or a combination thereof.

According to any embodiment of the first aspect of the present application, the first transition layer includes a nucleation layer and a buffer layer formed on the nucleation layer, and the nucleation layer is located between the buffer layer and the growth substrate, where the detaching the growth substrate by a laser lift-off process, where a detaching position is on the first transition layer, to make the epitaxial layer transferred to the transfer substrate, including: detaching the growth substrate and the nucleation layer by the laser lift-off process, where the detaching position is on the buffer layer, to make the epitaxial layer transferred to the transfer substrate.

According to a second aspect, the present application provides a semiconductor structure, including: an epitaxial layer, where the epitaxial layer includes a protection layer and an active structure layer which are stacked sequentially; on a first plane, an orthographic projection of the active structure layer is at least partially covered by an orthographic projection of the protection layer, and the first plane is perpendicular to an arrangement direction of the protection layer and the active structure layer; a surface, away from the active structure layer, of the protection layer is a planarization surface; and a transfer substrate, located on a side, away from the protection layer, of the active structure layer.

According to any embodiment of the second aspect of the present application, a material of the protection layer includes AlN or AlGaN.

According to any embodiment of the second aspect of the present application, the protection layer is N-type doped.

According to any embodiment of the second aspect of the present application, the semiconductor structure further includes: a second transition layer, located between the active structure layer and the protection layer, where on the first plane, an orthographic projection of the active structure layer is at least partially covered by an orthographic projection of the second transition layer.

According to any embodiment of the second aspect of the present application, a material of the second transition layer includes at least one of GaN, AlGaN and AlInGaN.

According to any embodiment of the second aspect of the present application, the growth substrate includes a sapphire substrate.

According to any embodiment of the second aspect of the present application, a material of the transfer substrate includes any elemental metal or two or more alloys of molybdenum, copper, titanium, tungsten, palladium, platinum, nickel, and chromium, or a Si substrate, a SiC substrate, a ceramic substrate, a sapphire, a glass material, an AlSi crystal, InP, GaAs, GaN, or a flexible substrate.

According to any embodiment of the second aspect of the present application, the active structure layer includes a Schottky barrier diode, a field effect transistor, a PN junction diode, a PNP triode, an NPN triode or an insulated-gate bipolar transistor.

In a method for manufacturing a semiconductor structure provided by the present application, a protection layer is formed on an epitaxial layer, and on a first plane, an orthographic projection of an active structure layer is at least partially covered by an orthographic projection of the protection layer, so that the protection effect on the active structure layer may be achieved in a process of detaching a growth substrate, and the damage to the epitaxial layer structure in the detaching process is reduced, thereby improving the application performance of the semiconductor structure. In addition, a first transition layer undergoes an epitaxial growth process from three dimensions to two dimensions, so that a surface, away from the growth substrate, of the first transition layer is a two-dimensional flat surface, and by etching the first transition layer up to the protection layer, the surface, away from the active structure layer, of the protection layer is to be a planarization surface, thereby reducing the leakage current and increasing the breakdown voltage when the manufactured semiconductor structure is used as a power device.

BRIEF DESCRIPTION OF THE DRAWINGS

FIG. 1 is a flowchart of a method for manufacturing a semiconductor structure according to an embodiment of the present application.

FIG. 2 is a diagram of a reflectivity curve of an epitaxial structure in an epitaxial growth process.

DETAILED DESCRIPTION OF THE EMBODIMENTS

Figure 3:
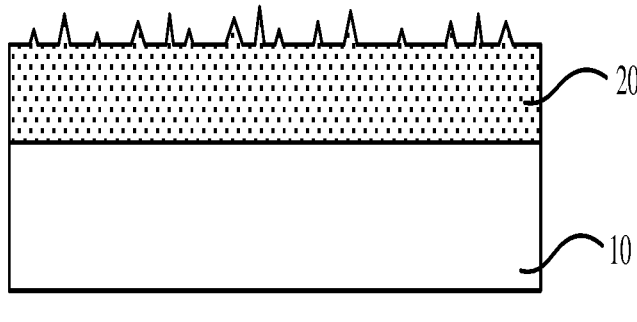
FIG. 3 to FIG. 8 are schematic structural diagrams of an intermediate structure corresponding to a process in FIG. 1.

In order to make the objectives, technical solutions, and beneficial technical effects of the present application clearer, the following describes the features and exemplary embodiments of various aspects of the present application in detail. In the following detailed description, numerous specific details are set forth in order to provide a thorough understanding of the present application. However, it will be apparent to those skilled in the art that the present application may be practiced without some of these specific details. The following description of the embodiments is merely to provide a better understanding of the present application by illustrating an example of the present application. In the drawings and the following description, at least a portion of the well-known structures and techniques are not shown in order to avoid unnecessarily obscuring the present application; and the dimensions of the partial structures may be exaggerated for clarity. Furthermore, the features, structures, or characteristics described below may be combined in any suitable manner in one or more embodiments.

In the description of the present application, it should be noted that, unless otherwise stated, "above" and "below" are inclusive of this number; the meaning of "a plurality of (types)" and "multiple (types)" is two or more; the orientation or positional relationship indicated by the terms "upper", "lower", "left", "right", "inner", "outer" and the like are merely for ease of description of the present application and the simplified description, rather than indicating or implying that the referred device or component must have a specific orientation, and be constructed and operated in a specific orientation, and therefore cannot be understood as a limitation to the present application. In addition, the terms "first", "second" and the like are merely intended for a purpose of description, and shall not be understood as an indication or implication of relative importance.

The above summary of the present application is not intended to describe each disclosed embodiment or each implementation in the present application. The following description, more particularly, exemplifies illustrative embodiments. At many places throughout the application, guidance is provided by a series of embodiments, which may be used in various combinations. In various examples, the recitation is merely a representative group and should not be construed as exhaustive.

In a manufacturing process of a GaN-based power semiconductor device, a GaN epitaxial structure grown on a substrate is usually transferred to a transfer substrate by a bonding technology and a laser lift-off technology. A laser lift-off process uses a short-wavelength laser of which the photon energy is greater than a GaN band gap and less than a substrate band gap, and after the laser passes through the substrate, strong absorption occurs at an interface between the substrate and GaN, so that the GaN is thermally decomposed to generate nitrogen and low-melting-point metal gallium, and the GaN epitaxial structure is separated from the substrate. In the research process, an inventor of the present application finds that after the GaN epitaxial layer is detached from the substrate by the laser lift-off process, a rough detaching surface is usually formed, and the leakage channel is increased, therefore, the leakage current is easily increased and the breakdown voltage is reduced when the manufactured semiconductor structure is used as a power device.

In order to solve the above technical problems, the embodiments of the present application provide the following technical solutions.

An embodiment of the first aspect of the present application provides a method for manufacturing a semiconductor structure, FIG. 1 is a flowchart of a method for manufacturing a semiconductor structure according to an embodiment of the present application, FIG. 2 is a diagram of a reflectivity curve of an epitaxial structure in an epitaxial growth process, and FIG. 3 to FIG. 9 are schematic diagrams of an intermediate structure corresponding to a process in FIG. 1, as shown in FIG. 1, and in combined with FIG. 2 to FIG. 9, the method includes the following steps.

Step S10: forming an epitaxial layer 20' on a side of a growth substrate 10, where the epitaxial layer 20' includes a first transition layer 20, a protection layer 30 and an active structure layer 50 sequentially epitaxially formed on the side of the growth substrate 10; a surface, away from the growth substrate 10, of the first transition layer 20 is a two-dimensional flat surface; on a first plane, an orthographic projection of the active structure layer 50 is at least partially covered by an orthographic projection of the protection layer 30, and the first plane is perpendicular to an arrangement direction of the protection layer 30 and the active structure layer 50.

Step S20: forming a transfer substrate 60 on a side, away from the growth substrate 10, of the epitaxial layer 20'.

Step S30: detaching the growth substrate 10 by a laser lift-off process, where a detaching position is on the first transition layer 20, to make the epitaxial layer 20' transferred to the transfer substrate 60.

Step S40: etching the first transition layer 20 up to the protection layer 30, to make a surface, away from the active structure layer 50, of the protection layer 30 to be a planarization surface.

In some embodiments, in step S10, an epitaxial growth method of the epitaxial layer 20' may be selected according to actual requirements, which is not specifically limited in this application. For example, an epitaxial growth method may include an atomic layer deposition (ALD) method, a chemical vapor deposition (CVD) method, a molecular beam epitaxy (MBE) method, a plasma enhanced chemical vapor deposition (PECVD) method, a low pressure chemical vapor deposition (LPCVD) method, a mental-organic chemical vapor deposition (MOCVD) method, or a combination thereof.

Figure 4:
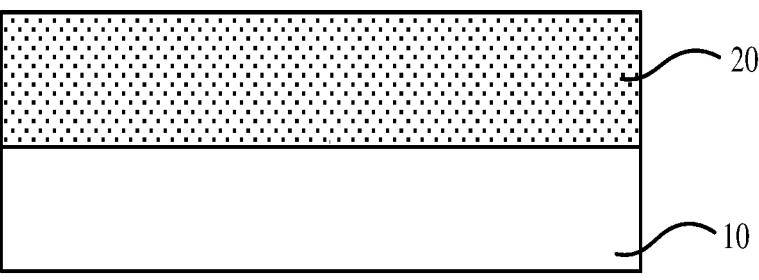

It should be noted that, as shown in FIG. 2, the dashed box refers to a reflectivity change curve of a first transition layer 20 during an epitaxial growth process from time t1 to time t2, a change rule of the reflectivity is first increased, and finally tends to a gentle, and in conjunction with FIG. 3 and FIG. 4, it is illustrated that a surface, away from a growth substrate 10, of the first transition layer 20, undergoes a crystal transformation process from a three-dimensional rough structure to a two-dimensional flat surface. In this embodiment of the present application, after the epitaxial growth process of the first transition layer 20 is performed to the two-dimensional flat surface, that is, after the time t2, a protection layer 30 and an active structure layer 50 are epitaxially manufactured, to make the surface, close to the first transition layer 20, of the protection layer 30 to be a planarization surface.

Figure 5:
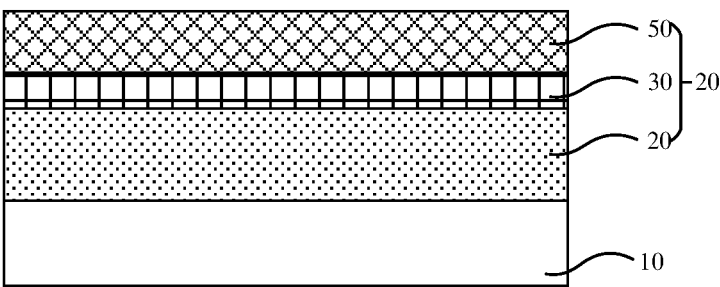

As shown in FIG. 5, a protective layer 30 is formed by epitaxy method between a first transition layer 20 and an active structure layer 50 in the present application, and on a first plane, an orthographic projection of the active structure layer 50 is at least partially covered by an orthographic projection of the protection layer 30, so that the protection layer 30 may protect the epitaxial layer 20', especially the active structure layer 50 in a subsequent detaching process, and reduce structural damage caused by the detaching process, thereby reducing the leakage channel and reducing the leakage current. It should be noted that, as shown in FIG. 5, the first plane is perpendicular to an arrangement direction of the protection layer 30 and the active structure layer 50, that is, the first plane is parallel to a plane where a growth substrate 10 is located.

In some embodiments, a material of the protection layer 30 may be selected according to actual requirements, which is not specifically limited in the present application. For example, the material of the protection layer 30 may be AlN or AlGaN and the like. The AlN is used as the material of the protection layer 30, and has advantages of low thermal expansion coefficient, difficulty in erosion and the like.

In some embodiments, a material of the first transition layer 20 may be selected according to actual requirements, which is not specifically limited in the present application. For example, the material of the first transition layer 20 may be GaN.

In some embodiments, a material of the growth substrate 10 may be selected according to actual requirements, which is not specifically limited in the present application. For example, the material of the growth substrate 10 may be sapphire.

Figure 6:
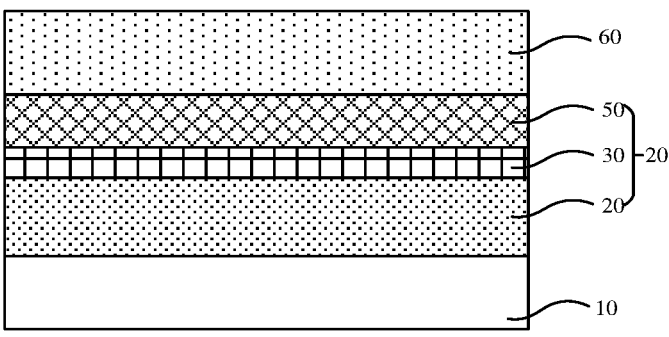

In some embodiments, in step S20, as shown in FIG. 6, a transfer substrate 60 is formed on a side, away from a growth substrate 10, of an epitaxial layer 20'.

Optionally, as shown in FIG. 6, an epitaxial layer 20' may be transferred to a transfer substrate 60 through a bonding medium layer (not shown in FIG. 6). Specifically, the bonding medium layer (not shown in FIG. 6) may be formed between the epitaxial layer 20' and the transfer substrate 60, and then the epitaxial layer 20' and the transfer substrate 60 are bonded together through the bonding medium layer to form a structure in which a growth substrate 10, the epitaxial layer 20' and the transfer substrate 60 are stacked sequentially.

Optionally, a type of the transfer substrate 60 may be selected according to actual requirements, which is not specifically limited in the present application. For example, a material of the transfer substrate 60 may be any elemental metal or two or more alloys of molybdenum (Mo), copper (Cu), titanium (Ti), tungsten (W), palladium (Pd), platinum (Pt), nickel (Ni), and chromium (Cr), or a Si substrate, a SiC substrate, a ceramic substrate, a sapphire, a glass material, or an AlSi crystal, or InP, GaAs. GaN, or a flexible substrate that is not limited to PET or PDMS material.

In some embodiments, a type of the bonding medium layer may be selected according to actual requirements, which is not specifically limited in the present application. For example, the bonding medium layer may be an oxide layer including silicon oxide; or a material of the bonding medium layer may be any elemental metal or two or more alloys of molybdenum (Mo), gold (Au), titanium (Ti), copper (Cu), palladium (Pd), platinum (Pt), tungsten (W), nickel (Ni), and chromium (Cr); or the bonding medium layer is a conductive polymers formed by a resin matrix with one or two or more of conductive particle silver (Ag), gold (Au), copper (Cu), aluminum (Al), zinc (Zn), iron (Fe), nickel (Ni) and graphite (C); or the bonding medium layer is conductive paste formed by particles of one or two or more of conductive particle silver (Ag), gold (Au), copper (Cu), aluminum (Al), zinc (Zn), iron (Fe), nickel (Ni) and graphite (C) with an adhesive, a solvent and an auxiliary agent; or the bonding medium layer is a silicate-based high-temperature conductive adhesive; or the bonding medium layer is a high-temperature alloy paste formed by metals such as nickel (Ni), chromium (Cr), silicon (Si), boron (B) and the like.

Figure 7:
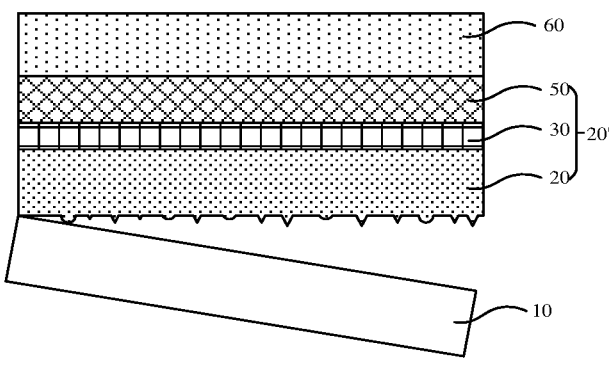
Figure 8:
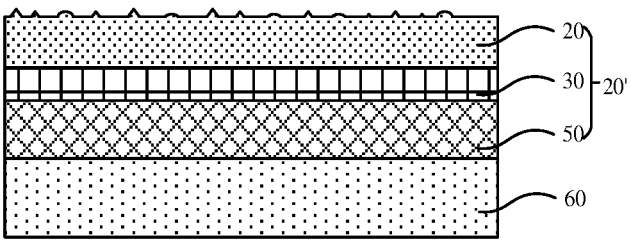

In some embodiments, in step S30, as shown in FIG. 7 and FIG. 8, a growth substrate 10 is detached, the detaching position is on a first transition layer 20, to make an epitaxial layer 20' transferred to a transfer substrate 60.

In some embodiments, a laser energy of the laser lift-off process is greater than a band gap energy of the first transition layer 20, and less than a band gap energy of the protection layer 30, thereby avoiding the etching damage of the laser to the protection layer 30, and retaining a N surface, close to a side of the growth substrate 10, of the protection layer 30. Optionally, the laser energy of the laser lift-off process is less than a band gap energy of the growth substrate 10. For example, a material of the growth substrate 10 is sapphire (a band gap energy is 9.9 eV), a material of the protection layer 30 is AlN (a band gap energy is 6.2 eV), a material of the first transition layer 20 is GaN (a band gap energy is 3.4 eV), a laser energy of 5 eV (a band gap energy is between the GaN and the AlN) may be used, the laser passes through the sapphire to irradiate the GaN, so that the GaN undergoes a decomposition reaction, the sapphire is detached, and the laser does not affect the AlN. Optionally, a material of the growth substrate 10 is sapphire, a material of the protection layer 30 is AlGaN (a band gap energy is between 3.4 eV and 6.2 eV), a material of the first transition layer 20 is GaN, and a laser energy between GaN and AlGaN may be used, to make the growth substrate detached.

In some embodiments, a laser energy density of the laser in the laser lift-off process is 200-5000 mJ/cm$^2$, optionally, a heating temperature of a heater in the laser lift-off process is 650-800° C.

In this embodiment of the present application, as shown in FIG. 8, in a manufacturing process of a semiconductor structure, after a growth substrate 10 is detached, a rough surface may be formed on a detached surface of a first transition layer 20, and an epitaxial layer 20', especially an active structure layer 50 therein may be damaged to a certain extent during a detaching process. In the present application, a protection layer 30 is provided in an epitaxial layer, and on a first plane, an orthographic projection of the active structure layer 50 is at least partially covered by an orthographic projection of the protection layer 30, so that the epitaxial layer 20', especially the active structure layer 50 therein, may be protected during the detaching process, and a structural damage caused by the detaching process is reduced, thereby reducing the leakage channel and reducing the leakage current.

Figure 9:
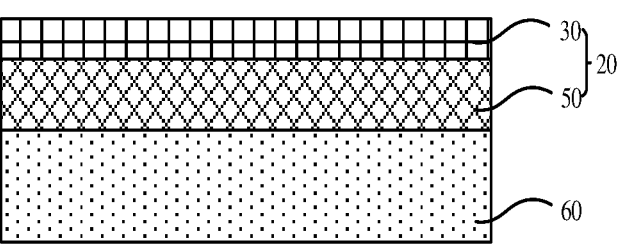
FIG. 9 is a schematic diagram of a semiconductor structure according to an embodiment of the present application.

In some embodiments, in step S40, as shown in FIG. 9, a first transition layer 20 is etched up to a protection layer 30, to make a surface, away from an active structure layer 50, of a protection layer 30 to be a planarization surface. The first transition layer 20 is etched, and until an element (such as an Al element) contained in the protection layer 30 is detected, etching is stopped. Optionally, in the present application, selective dry etching is performed on the first transition layer 20. Optionally, a material of the protection layer 30 may be AlN or AlGaN. The AlN and AlGaN include Al element which may be used as a detection element of an etching stop process of the first transition layer 20. A material of the first transition layer 20 selects GaN, and in the dry etching process, an etching selection ratio of the protection layer 30 and the first transition layer 20 is different, so that when the Al element is detected at an end point, the etching can be stopped, and there is little over-etching.

Optionally, as shown in FIG. 8, in step S30, after a growth substrate 10 is detached, a detached surface of a first transition layer 20 forms a rough surface, and the surface usually remains with a residue (such as a Ga drop residue), the residue may be removed by adding a surface treatment process to the detaching position, to perform preprocessing for etching the first transition layer 20 in subsequent step S40, and a phenomenon that the application performance of the semiconductor device is reduced due to interference in the operation process in step S40 is avoided. Optionally, a method for performing surface treatment processing on the detached surface of the first transition layer 20 may be selected according to actual requirements, which is not specifically limited in this application. For example, a hydrochloric acid soaking method or an atmosphere corrosion method may be used to treat a surface of the detaching position.

In some embodiments, the active structure layer 50 may be a power device. For example, the active structure layer 50 may be a Schottky barrier diode (SBD), a field effect transistor (FET), a PN junction diode, a PNP triode, an NPN triode or an insulated gate bipolar transistor (IGBT), and the like.

In some embodiments, in step S10, N-type doping is performed on the protection layer 30 when the protection layer 30 is formed by epitaxy method. Optionally, the protection layer 30 is N-type heavily doped, a doping concentration is greater than or equal to 1E18 cm$^{-1}$, and optionally, a material of the protection layer 30 may be N-type AlGaN. It should be noted that the N-type doped protection layer 30 may be formed by introducing an N-type dopant during a epitaxial process of the protection layer 30, or after the epitaxial layer is formed, N-type doping is performed on the protection layer 30 by means of ion implantation.

Figure 10:
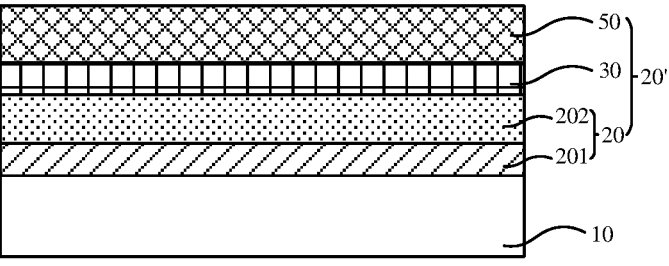
FIG. 10 and FIG. 11 are schematic structural diagrams of an intermediate structure corresponding to a process in FIG. 1.
Figure 11:
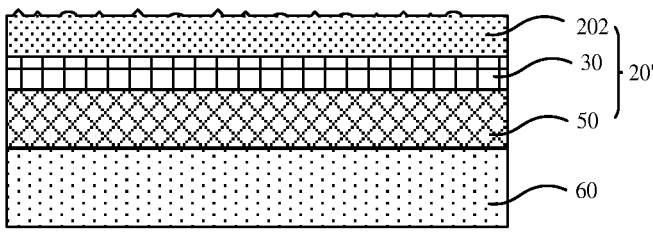

In some embodiments, FIG. 10 to FIG. 11 are schematic structural diagrams of an intermediate structure corresponding to a process in FIG. 1. As shown in FIG. 10, a first transition layer 20 includes a nucleation layer 201 and a buffer layer 202 formed on the nucleation layer 201, and the nucleation layer 201 is located between the buffer layer 202 and a growth substrate 10. As shown in FIG. 11, a detaching position is located on the buffer layer 202, that is, in this embodiment, the growth substrate 10 and the nucleation layer 201 may be detached together when performing a detaching operation.

In this embodiment of the present application, the nucleation layer 201 is configured as a nucleation center in the epitaxial growth process, so that lattice mismatch between the substrate and the epitaxial layer can be relieved, and the crystal quality is improved; and due to the arrangement of the buffer layer 202, stress in the epitaxial layer structure above the substrate can be buffered, cracking of the epitaxial layer structure is avoided, and stability is enhanced.

In some embodiments, the type of the nucleation layer 201 may be selected according to actual requirements, which is not specifically limited in the present application. For example, a material of the nucleation layer 201 may be at least one of GaN, AlN, and AlGaN. Optionally, a GaN nucleation layer and a AlN nucleation layer may be formed by a low temperature (LT) epitaxial growth method or a physical vapor deposition (PVD) method.

In some embodiments, the type of the buffer layer 202 may be selected according to actual requirements, which is not specifically limited in this application. For example, a material of the buffer layer 202 may be at least one of GaN, AlGaN and AlInGaN.

The embodiment of the second aspect of the present application provides a semiconductor structure, which is manufactured by the method provided in embodiments of the first aspect of the present application. As shown in FIG. 9, the semiconductor structure includes an epitaxial layer 20', where the epitaxial layer 20' includes a protection layer 30 and an active structure layer 50 which are stacked sequentially; on a first plane, an orthographic projection of the active structure layer 50 is at least partially covered by an orthographic projection of the protection layer 30, the first plane is perpendicular to an arrangement direction of the protection layer 30 and the active structure layer 50; a surface, away from the active structure layer 50, of the protection layer 30 is a planarization surface; and a transfer substrate 60 located on a side, away from the protection layer 30, of the active structure layer 50.

It should be noted that, as shown in FIG. 3 to FIG. 5, before a protection layer 30 is epitaxially manufactured, a first transition layer 20 needs to complete a crystal transformation process from a three-dimensional rough structure to a two-dimensional flat surface, and a surface of the first transition layer 20 is a two-dimensional flat surface finally, so that a surface, close to the first transition layer 20, of the protection layer 30 is a planarization surface, that is, a surface, away from an active structure layer 50, of the protection layer 30 is a planarization surface, and when a semiconductor structure is used as a power device, a leakage current may be reduced and a breakdown voltage may be increased.

In some embodiments, a material of the protection layer 30 of the semiconductor structure may be selected according to actual requirements, which is not specifically limited in this application. For example, the material of the protection layer 30 may be AlN or AlGaN, and the like. The AlN or the AlGaN includes an Al element, and may be used as a detection element of an etching stop process of the first transition layer 20 in a detaching process of manufacturing the semiconductor structure. The AlN is used as the material of the protection layer 30, and has an advantages of low thermal expansion coefficient, difficulty in erosion and the like.

In some embodiments, the type of the transfer substrate 60 of the semiconductor structure may be selected according to actual requirements, as long as the transfer substrate 60 has good conductivity, which is not specifically limited in this application. For example, a material of the transfer substrate 60 may be any elemental metal or two or more alloys of molybdenum (Mo), copper (Cu), titanium (Ti), tungsten (W), palladium (Pd), platinum (Pt), nickel (Ni), and chromium (Cr), or a Si crystal, a SiC crystal, a ceramic substrate, a sapphire crystal, a glass material, or an AlSi crystal, or InP, GaAs, GaN, or a flexible substrate that is not limited to PET or PDMS material.

In some embodiments, the active structure layer 50 may be a power device. For example, the active structure layer 50 may be a Schottky barrier diode (SBD), a field effect transistor (FET), a PN junction diode, a PNP triode, an NPN triode or an insulated gate bipolar transistor (IGBT), and the like.

Specifically, the active structure layer 50 may be a high electron mobility transistor (HEMT), and the specific structure includes a channel layer and a barrier layer that are stacked sequentially and may generate a two-dimensional electron gas, and further includes a gate, a drain, and a source located on a side, away from the channel layer, of the barrier layer.

In some embodiments, the protection layer 30 is N-type doped. Optionally, the protection layer 30 is N-type heavily doped, a doping concentration is greater than or equal to $1E18$ cm$^{-1}$. Optionally, a material of the protection layer 30 may be N-type AlGaN.

Optionally, when the active structure layer 50 is a Schottky barrier diode (SBD), the protection layer 30 is N-type heavily doped, and a back ohmic contact of the SBD power device may be improved.

Figure 12:
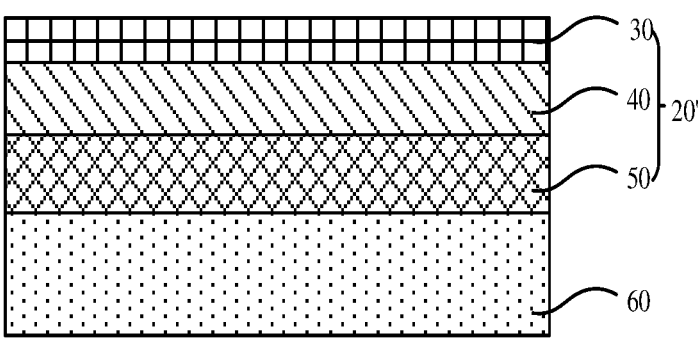
FIG. 12 is a schematic diagram of a semiconductor structure according to another embodiment of the present application.

In some embodiments, FIG. 12 is a schematic diagram of a semiconductor structure according to another embodiment of the present application, as shown in FIG. 12, an epitaxial layer 20' further includes a second transition layer 40, the second transition layer 40 is located between an active structure layer 50 and a protection layer 30, and on a first plane, an orthographic projection of the active structure layer 50 is at least partially covered by an orthographic projection of the second transition layer 40. Optionally, after the second transition layer 40 is formed on the protection layer 30, the active structure layer 50 is formed, and the active structure layer 50 is at least partially covered by an orthographic projection, on a growth substrate 10, of the second transition layer 40.

In some embodiments, the type of the second transition layer 40 may be selected according to actual requirements, which is not specifically limited in present application. For example, the second transition layer 40 may be at least one of GaN-based materials, such as GaN, AlGaN, AlInGaN, and the like.

According to the embodiments of the present application, the second transition layer 40 is provided between the protection layer 30 and the active structure layer 50, and the active structure layer 50 is at least partially covered by the orthographic projection, on the growth substrate 10, of the second transition layer 40, so that the stress in the epitaxial layer structure may be further buffered, the cracking of the epitaxial layer structure caused by subsequent processes such as detaching and etching is weakened, and the buffer protection effect on the active structure layer and the semiconductor structure is achieved.

In some embodiments, the semiconductor device may be a semiconductor power device, for example, a MOS controlled thyristor (MCT), an electron injection enhanced gate transistor (IEGT), a pulse power closed switch thyristor, and the like.

The foregoing is merely a specific embodiment of the present application, but the protection scope of the present application is not limited thereto, and any person skilled in the art would easily conceive of various equivalent modifications or substitutions within the technical scope disclosed in the present application, and these modifications or substitutions should be covered within the protection scope of the present application. Therefore, the protection scope of the present application shall be subject to the protection scope of the claims.

What is claimed is:

1. A method for manufacturing a semiconductor structure, comprising:
forming an epitaxial layer on a side of a growth substrate,
wherein the epitaxial layer comprises a first transition layer, a protection layer and an active structure layer which are sequentially epitaxially formed on the side of the growth substrate;

a surface, away from the growth substrate, of the first transition layer is a two-dimensional flat surface;

on a first plane, an orthographic projection of the active structure layer is at least partially covered by an orthographic projection of the protection layer, and the first plane is perpendicular to an arrangement direction of the protection layer and the active structure layer;

forming a transfer substrate on a side, away from the growth substrate, on the epitaxial layer;

detaching the growth substrate by a laser lift-off process, wherein a detaching position is on the first transition layer, to make the epitaxial layer transferred to the transfer substrate;

etching the first transition layer up to the protection layer, to make a surface, away from the active structure layer, of the protection layer to be a planarization surface; and wherein during a time window of the epitaxially forming the epitaxial layer, the first transition layer undergoes a crystal transformation process from a three-dimensional rough structure to a two-dimensional flat surface before forming the protection layer and the active structure layer sequentially on the first transition layer.

2. The method according to claim 1, wherein a laser energy of the laser lift-off process is greater than a band gap energy of the first transition layer, and less than a band gap energy of the protection layer.

3. The method according to claim 1, wherein a laser energy density of a laser in the laser lift-off process is 200-5000 mJ/cm².

4. The method according to claim 1, wherein a heating temperature of a heater in the laser lift-off process is 650-800° C.

5. The method according to claim 1, wherein a material of the protection layer comprises AlN or AlGaN.

6. The method according to claim 1, wherein N-type doping is performed on the protection layer when the protection layer is formed by epitaxy method.

7. The method according to claim 1, wherein a material of the first transition layer comprises GaN.

8. The method according to claim 1, wherein the growth substrate comprises a sapphire substrate.

9. The method according to claim 1, wherein a material of the transfer substrate comprises any elemental metal or two or more alloys of molybdenum, copper, titanium, tungsten, palladium, platinum, nickel and chromium, or a Si substrate, a SiC substrate, a ceramic substrate, a sapphire, a glass material, an AlSi crystal, InP, GaAs, GaN, or a flexible substrate.

10. The method according to claim 1, wherein the active structure layer comprises a Schottky barrier diode, a field effect transistor, a PN junction diode, a PNP triode, an NPN triode or an insulated-gate bipolar transistor.

11. The method according to claim 1, wherein an epitaxial growth method of the epitaxial layer comprises an atomic layer deposition method, a chemical vapor deposition method, a molecular beam epitaxy method, a plasma enhanced chemical vapor deposition method, a low pressure chemical vapor deposition method, a metal-organic chemical vapor deposition method, or a combination thereof.

12. The method according to claim 1, wherein the first transition layer comprises a nucleation layer and a buffer layer formed on the nucleation layer, and the nucleation layer is located between the buffer layer and the growth substrate, wherein the detaching the growth substrate by a laser lift-off process, wherein a detaching position is on the first transition layer, to make the epitaxial layer transferred to the transfer substrate, comprises:

detaching the growth substrate and the nucleation layer by the laser lift-off process, wherein the detaching position is on the buffer layer, to make the epitaxial layer transferred to the transfer substrate.

* * * * *